(12) United States Patent
Lee et al.

(10) Patent No.: US 10,062,652 B2
(45) Date of Patent: Aug. 28, 2018

(54) FAN-OUT SEMICONDUCTOR PACKAGE AND METHOD OF MANUFACTURING SAME

(71) Applicant: SAMSUNG ELECTRO-MECHANICS CO., LTD., Suwon-si, Gyeonggi-do (KR)

(72) Inventors: Ji Hyun Lee, Suwon-si (KR); Kyoung Moo Harr, Suwon-si (KR); Seung Yeop Kook, Suwon-si (KR); Ji Hoon Kim, Suwon-si (KR); Young Gwan Ko, Suwon-si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/352,100

(22) Filed: Nov. 15, 2016

(65) Prior Publication Data

US 2017/0271272 A1    Sep. 21, 2017

(30) Foreign Application Priority Data

Mar. 15, 2016    (KR) .................. 10-2016-0031150

(51) Int. Cl.
*H01L 23/538* (2006.01)
*H01L 23/00* (2006.01)
(Continued)

(52) U.S. Cl.
CPC .......... *H01L 23/562* (2013.01); *H01L 21/486* (2013.01); *H01L 21/4853* (2013.01);
(Continued)

(58) Field of Classification Search
CPC ......... H01L 23/48; H01L 24/00; H01L 24/19; H01L 23/562; H01L 23/5386; H01L 23/5384; H01L 23/5383; H01L 23/5389
See application file for complete search history.

(56) References Cited

U.S. PATENT DOCUMENTS 8,237,060 B2    8/2012   Tanaka
8,354,304 B2    1/2013   Chow et al.
(Continued)

FOREIGN PATENT DOCUMENTS

KR    10-2013-0132161 A    12/2013
KR    10-2013-0132162 A    12/2013
KR    10-2013-0132163 A    12/2013

OTHER PUBLICATIONS

Non-Final Office Action issued in related U.S. Appl. No. 15/913,270, dated Jun. 26, 2018.

*Primary Examiner* — Kyoung Lee
*Assistant Examiner* — Christina Sylvia
(74) *Attorney, Agent, or Firm* — McDermott Will & Emery LLP

(57) ABSTRACT

The present disclosure relates to a fan-out semiconductor package including a frame having a through hole, a semiconductor chip disposed in the through hole, a first encapsulant disposed in a space between the frame and the semiconductor chip, a second encapsulant disposed on one sides of the frame and the semiconductor chip, and a redistribution layer disposed on the other sides of the frame and the semiconductor chip, and a method of manufacturing the same. The first encapsulant and the second encapsulant may include different materials.

18 Claims, 14 Drawing Sheets

(51) Int. Cl.
*H01L 23/31* (2006.01)
*H01L 21/48* (2006.01)
*H01L 21/56* (2006.01)

(52) U.S. Cl.
CPC ........ *H01L 21/4857* (2013.01); *H01L 21/565* (2013.01); *H01L 23/3135* (2013.01); *H01L 23/5383* (2013.01); *H01L 23/5384* (2013.01); *H01L 23/5386* (2013.01); *H01L 23/5389* (2013.01)

(56) References Cited

U.S. PATENT DOCUMENTS

| | | | |
|---|---|---|---|
| 2005/0121765 A1* | 6/2005 | Lin | H01L 23/49816 257/686 |
| 2008/0237828 A1 | 10/2008 | Yang | |
| 2010/0133704 A1* | 6/2010 | Marimuthu | H01L 21/565 257/778 |
| 2015/0001708 A1* | 1/2015 | Lin | H01L 23/49811 257/737 |
| 2015/0021754 A1* | 1/2015 | Lin | H01L 23/5389 257/712 |
| 2015/0187742 A1 | 7/2015 | Kwon et al. | |
| 2016/0338202 A1* | 11/2016 | Park | H01L 23/48 |

* cited by examiner

I - I'

US 10,062,652 B2

FAN-OUT SEMICONDUCTOR PACKAGE AND METHOD OF MANUFACTURING SAME

CROSS-REFERENCE TO RELATED APPLICATION

This application claims the benefit of priority to Korean Patent Application No. 10-2016-0031150, filed on Mar. 15, 2016 with the Korean Intellectual Property Office, the entirety of which is incorporated herein by reference.

TECHNICAL FIELD

The present disclosure relates to a semiconductor package, such as a fan-out panel level package (PLP).

BACKGROUND

A semiconductor package is defined as a type of package technology for electrically connecting a semiconductor chip to a printed circuit board (PCB), such as a main board of an electronic device, or the like, and protecting the the semiconductor chip from external impacts, and is distinguished from a technology of embedding semiconductor chips in a PCB, such as an interposer substrate. A significant recent trend in the development of technology related to the semiconductor chip is to reduce the size of the semiconductor chip. Hence, in a package field, in accordance with a rapid increase in demand for compact semiconductor chip, or the like, a semiconductor package having a compact size and including a plurality of pins has been demanded.

One type of package technology suggested to satisfy the technical demand as described above is a wafer level package (WLP) using redistribution of an electrode pad included in a semiconductor chip formed on a wafer. WLPs include a fan-in WLP and a fan-out WLP. In particular, the fan-out WLP has a reduced size, and is advantageous in terms of implementing a plurality of pins. Therefore, the fan-out WLP has been actively developed.

Meanwhile, in the case of the abovementioned WLPs in which a semiconductor chip is merely encapsulated by a common encapsulant, it is difficult to properly control various side effects that may occur in the manufacturing process, such as shifting of a semiconductor chip and warpage of a fan-out semiconductor package.

SUMMARY

An aspect of the present disclosure may provide a fan-out semiconductor package having a novel structure that may effectively control various side effects that may occur in a manufacturing process thereof, and a method of efficiently manufacturing the same.

An aspect of the present disclosure may provide a frame that may reinforce rigidity of a fan-out semiconductor package in a region in which a semiconductor chip is encapsulated, and may encapsulate the semiconductor chip with a plurality of encapsulants including different materials.

According to an aspect of the present disclosure, a fan-out semiconductor package includes: a frame having a through hole; a semiconductor chip disposed in the through hole; a first encapsulant disposed in a space between the frame and the semiconductor chip; a second encapsulant disposed on one sides of the frame and the semiconductor chip; and a redistribution layer disposed on the other sides of the frame and the semiconductor chip. The first encapsulant and the second encapsulant include different materials.

According to an aspect of the present disclosure, a method of manufacturing a fan-out semiconductor package includes: preparing a frame having a through hole; disposing a semiconductor chip in the through hole; disposing a first encapsulant in a space between the frame and the semiconductor chip; disposing a second encapsulant on one sides of the frame and the semiconductor chip; and forming a redistribution layer on the other sides of the frame and the semiconductor chip. The first encapsulant and the second encapsulant include different materials.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
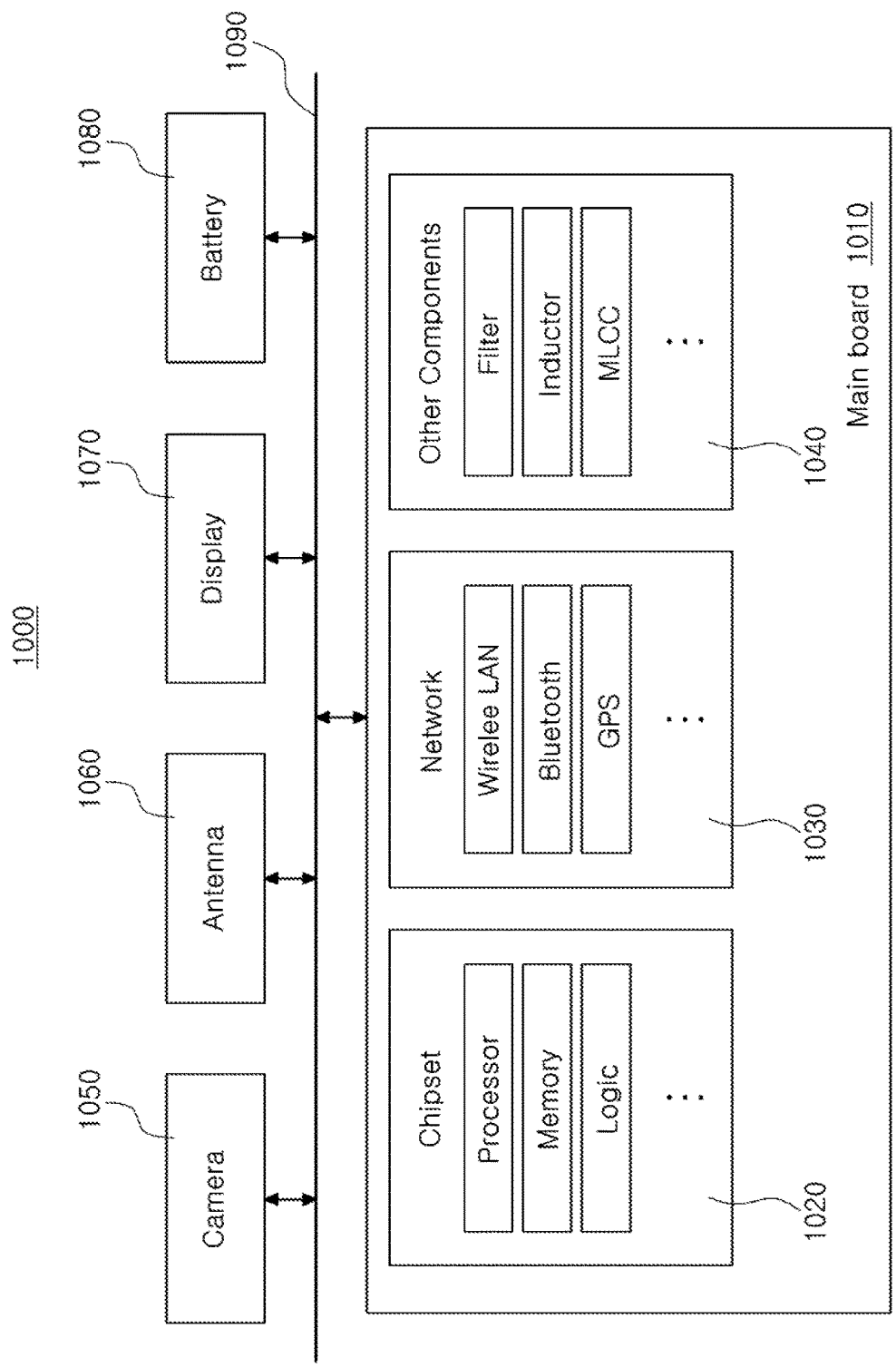
FIG. 1 is a schematic block diagram illustrating an example of an electronic device system.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Electronic Device

FIG. 1 is a schematic block diagram illustrating an example of an electronic device system.

Referring to FIG. 1, an electronic device 1000 may accommodate a mother board 1010. The mother board 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on type of the electronic device 1000, the electronic device 1000 may include other components that may or may not be physically or electrically connected to the mother board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
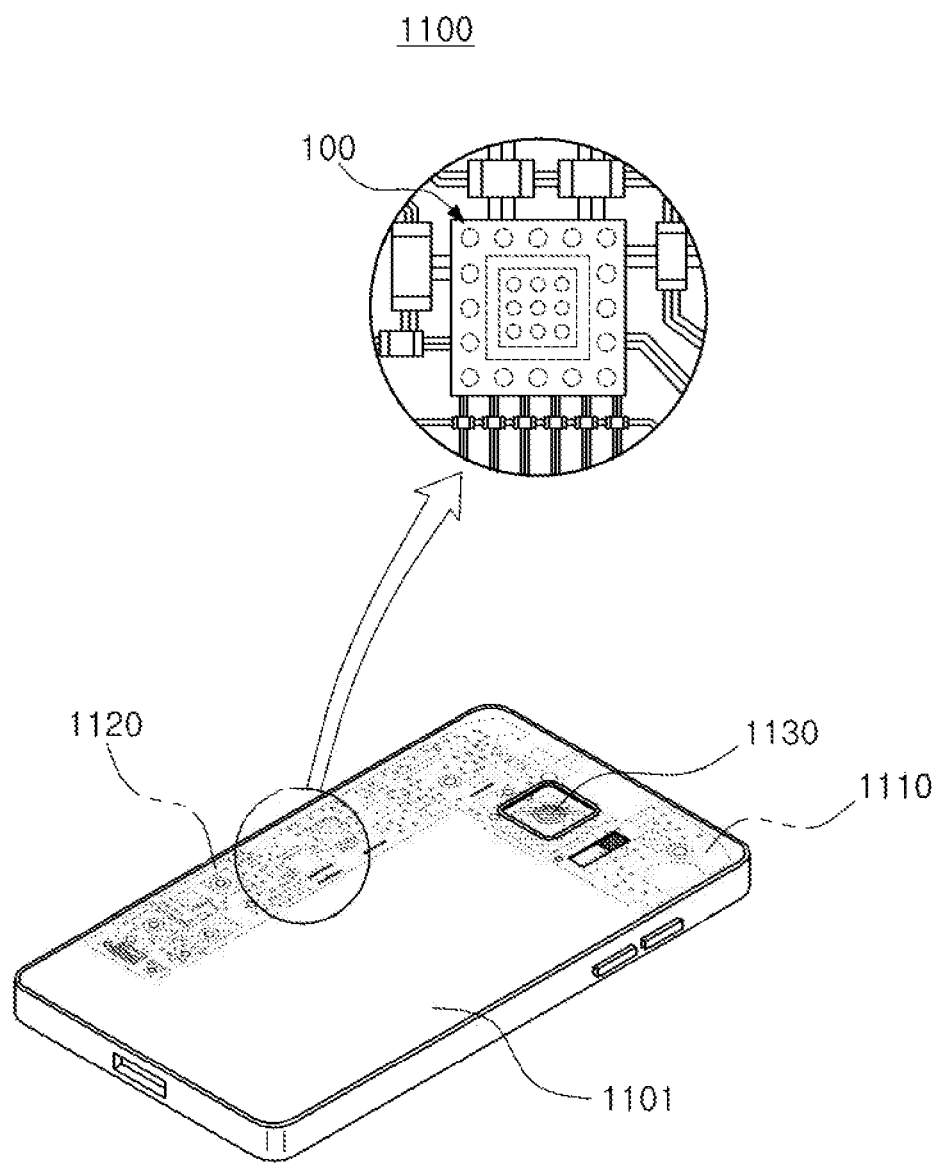
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a main board 1110 may be accommodated in a body 1101 of a smartphone 1100, and various electronic components 1120 may be physically or electrically connected to the main board 1110. In addition, other components that may or may not be physically or electrically connected to the main board 1110, such as the camera module 1050, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself is not used, but is packaged and is used in an electronic device, or the like, in a packaged state.

Here, semiconductor packaging is required due to the existence of a difference in a circuit width between the semiconductor chip and a main board of the electronic device in terms of electrical connections. In detail, connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and a packaging technology for buffering a difference in a circuit width between the semiconductor chip and the main board is required.

A semiconductor package manufactured by the packaging technology may be divided into a fan-in semiconductor package and a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
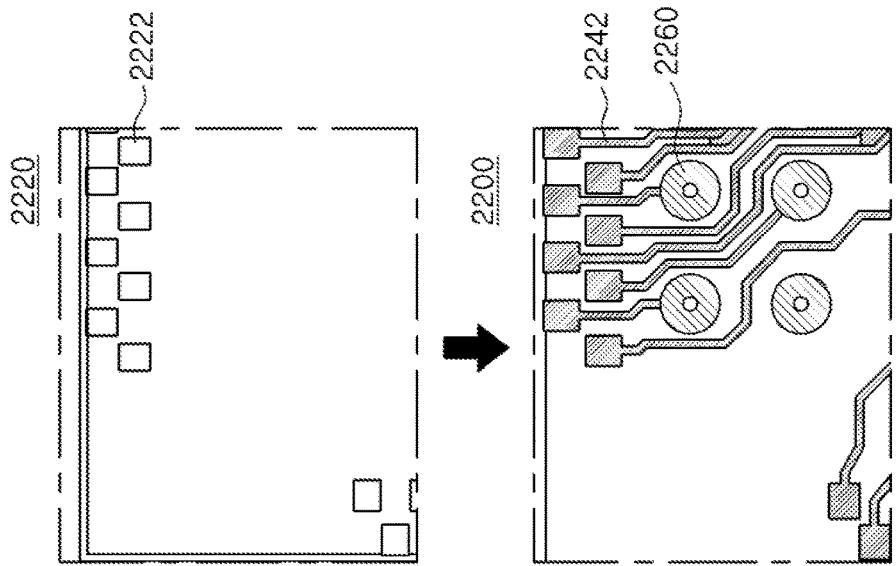
FIGS. 3A and 3B are schematic cross-sectional views illustrating states of a fan-in semiconductor package before and after being packaged.
Figure 3A:
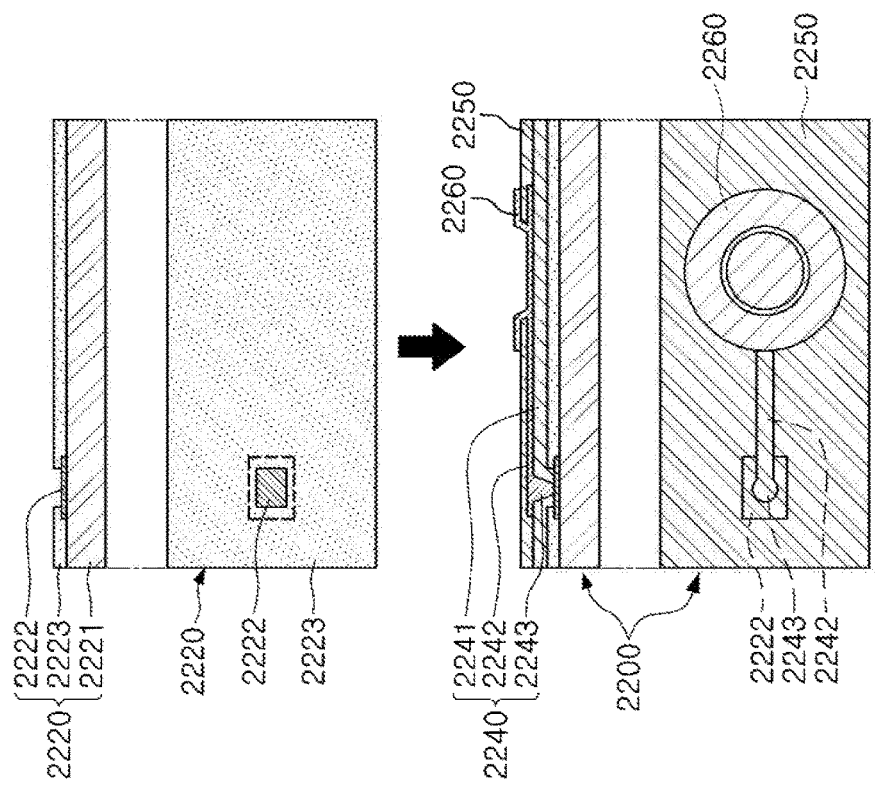

FIGS. 3A and 3B are schematic cross-sectional views illustrating states of a fan-in semiconductor package before and after being packaged.

Figure 4:
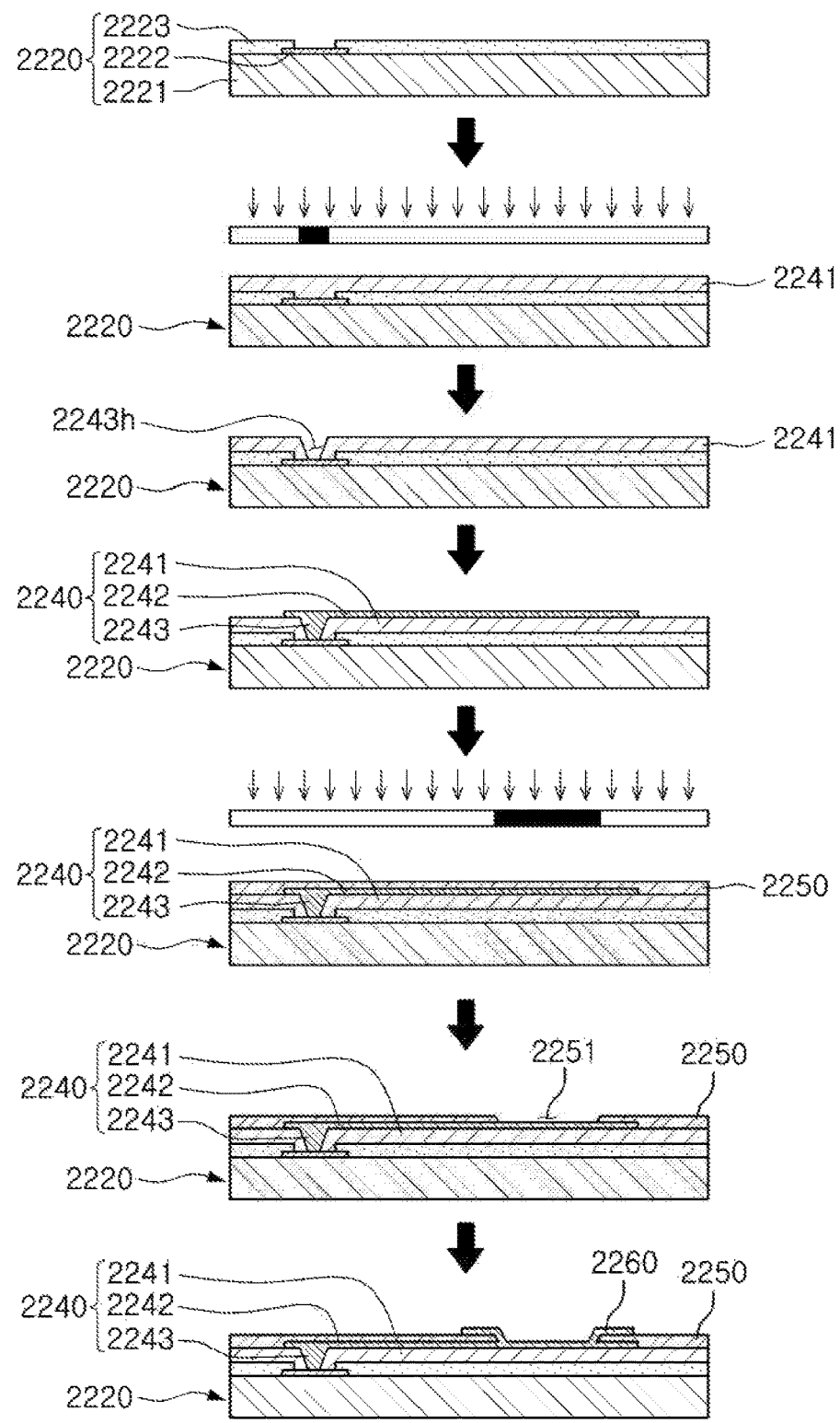
FIG. 4 is schematic cross-sectional views illustrating a packaging process of a fan-in semiconductor package.

FIG. 4 is schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. Here, since the connection pads 2222 are very small, it is difficult to mount the integrated circuit (IC) on an intermediate level printed circuit board (PCB) as well as on the main board of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photoimagable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in a smartphone have been manufactured in fan-in semiconductor package form. In detail, many elements mounted in the smartphone have been developed to implement a rapid signal transfer while having a compact size.

However, since all of the I/O terminals need to be disposed inside the semiconductor chip in the fan-in semiconductor package, the fan-in semiconductor package has a large spatial limitation. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the main board of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the main board of the electronic device.

Figure 5:
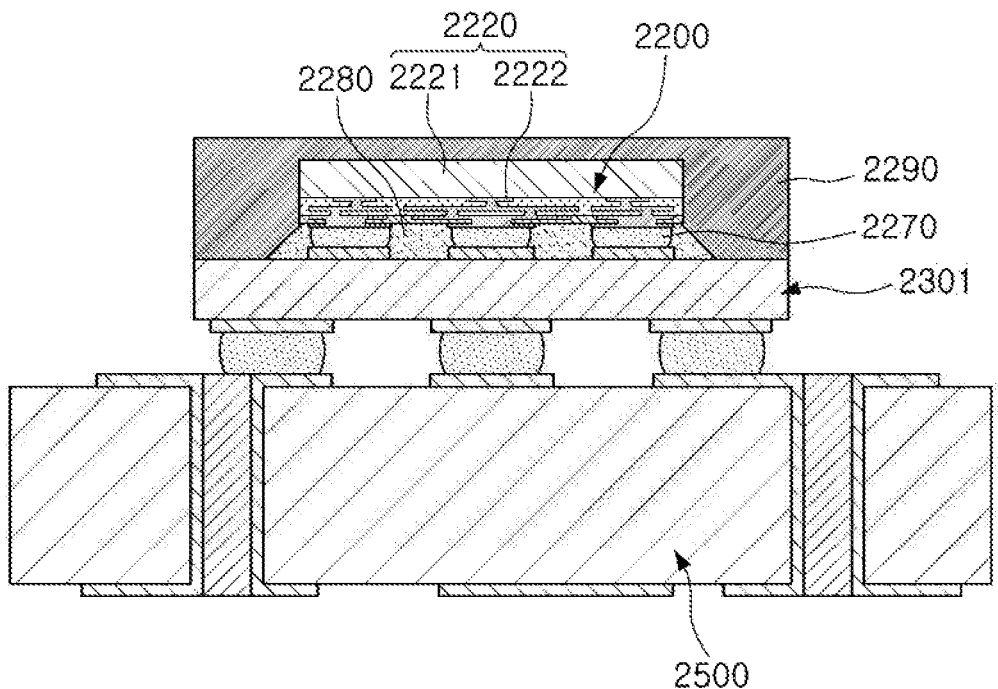
FIG. 5 is a schematic cross-sectional view illustrating a case in which a fan-in semiconductor package is mounted on an interposer substrate and is finally mounted on a main board of an electronic device.

FIG. 5 is a schematic cross-sectional view illustrating a case in which a fan-in semiconductor package is mounted on an interposer substrate and is finally mounted on a main board of an electronic device.

Figure 6:
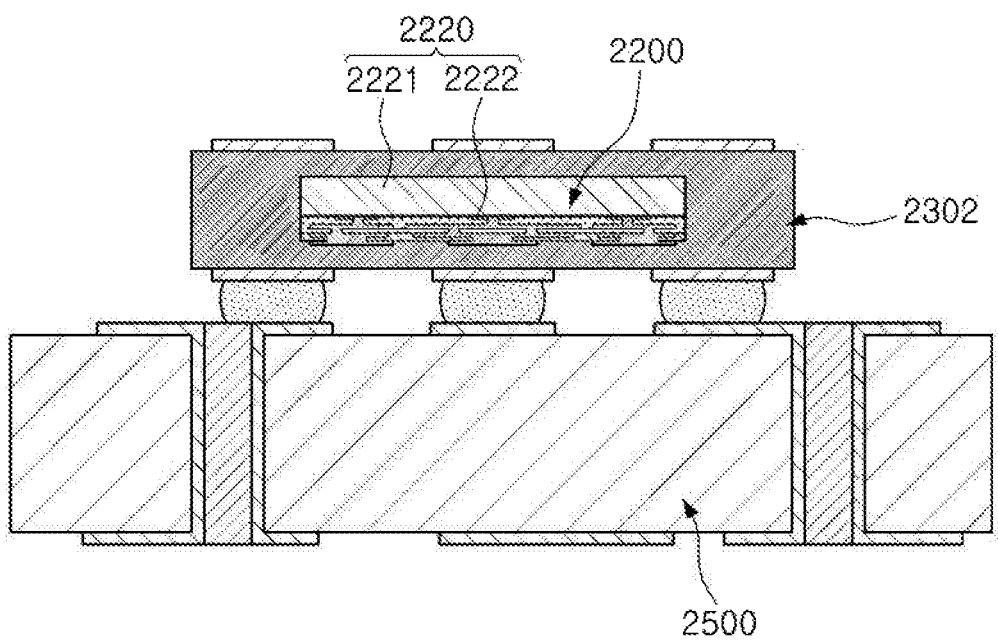
FIG. 6 is a schematic cross-sectional view illustrating a case in which a fan-in semiconductor package is embedded in an interposer substrate and is finally mounted on a main board of an electronic device.

FIG. 6 is a schematic cross-sectional view illustrating a case in which a fan-in semiconductor package is embedded in an interposer substrate and is finally mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be finally mounted on a main board 2500 of an electronic device in a state in which it is mounted on the interposer substrate 2301. Here, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed once more by the interposer substrate 2302 in a state in which the fan-in semiconductor package 2200 is embedded in the interposer substrate 2302, and the fan-in semiconductor package 2200 may be finally mounted on a main board 2500 of an electronic device.

As described above, it may be difficult to directly mount and use the fan-in semiconductor package on the main board of the electronic device. Therefore, the fan-in semiconductor package may be mounted on the separate interposer substrate and be then mounted on the main board of the electronic device through a packaging process or may be mounted and used on the main board of the electronic device in a state in which it is embedded in the interposer substrate.

Fan-Out Semiconductor Package

Figure 7:
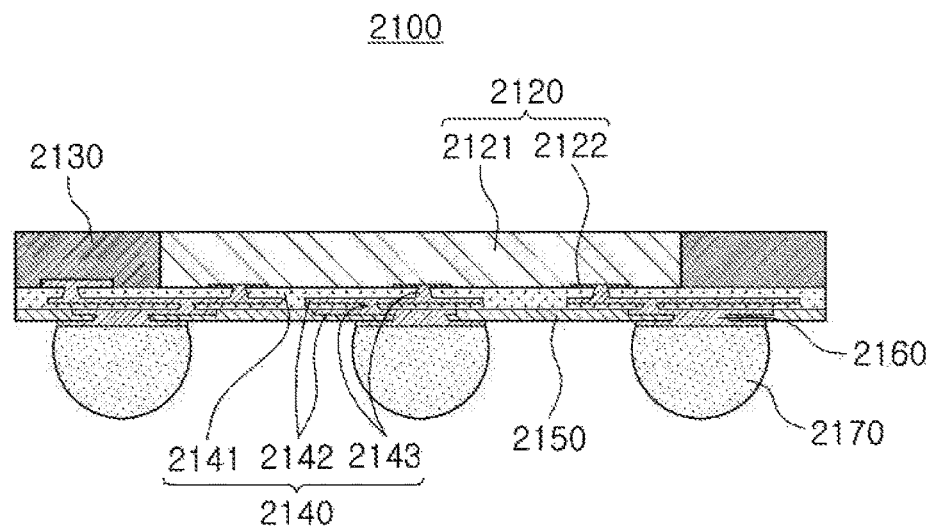
FIG. 7 is a schematic cross-sectional view illustrating a fan-out semiconductor package.

FIG. 7 is a schematic cross-sectional view illustrating a fan-out semiconductor package.

Referring to the drawing, in a fan-out semiconductor package 2100, for example, an outer side of a semiconductor chip 2120 may be protected by an encapsulant 2130, and connection pads 2122 of the semiconductor chip 2120 may be redistributed up to the outer side of the semiconductor chip 2120 by a connection member 2140. Here, a passivation layer 2150 may be further formed on the connection member 2140, and underbump metal layers 2160 may be further formed in openings of the passivation layer 2150. Solder balls 2170 may be further formed on the underbump metal layers 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed up outwardly of the semiconductor chip through the connection member formed on the semiconductor chip. As described above, in the fan-in semiconductor package, all of the I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed up to the outer side of the semiconductor chip through the connection member formed on the semiconductor chip as described above. Therefore, even though a size of the semiconductor chip is decreased, a standardized ball layout may be used in the fan-out semiconductor package as it is, such that the fan-out semiconductor package may be mounted on the main board of the electronic device without using a separate interposer substrate, as described below.

Figure 8:
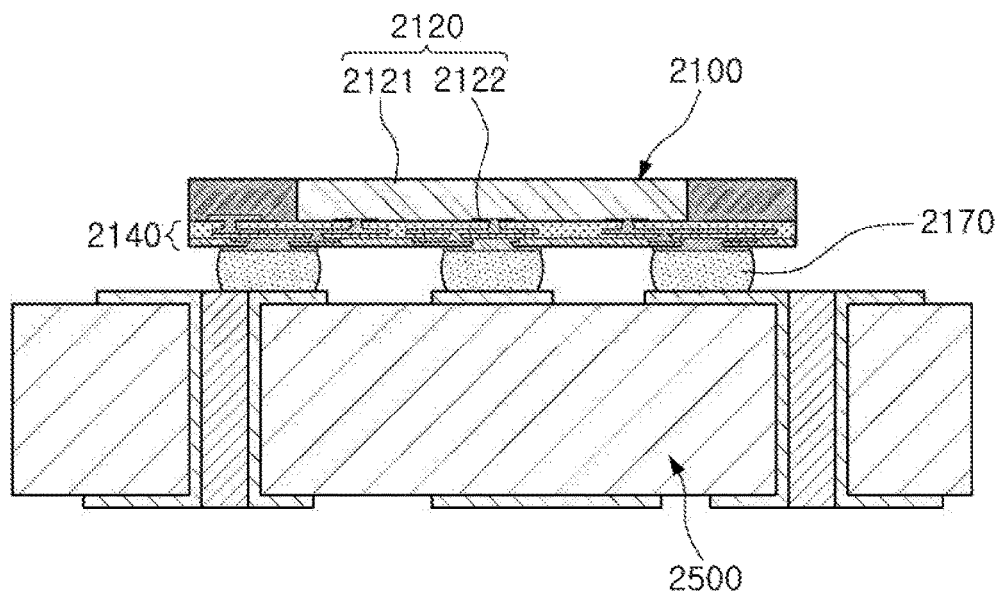
FIG. 8 is a schematic cross-sectional view illustrating a case in which a fan-out semiconductor package is mounted on a main board of an electronic device.

FIG. 8 is a schematic cross-sectional view illustrating a case in which a fan-out semiconductor package is mounted on a main board of an electronic device.

Referring to the drawing, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 up to a fan-out region that is out of a size of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness less than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to occurrence of a warpage phenomenon.

Meanwhile, the fan-out semiconductor package refers to a package technology for mounting the semiconductor chip on the main board of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Figure 9:
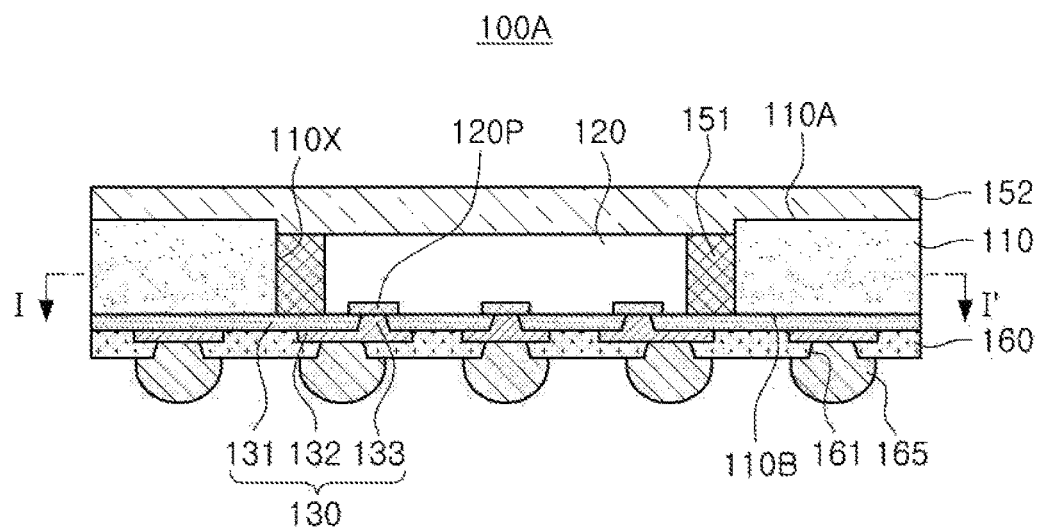
FIG. 9 is a schematic cross-sectional view illustrating an example of a fan-out semiconductor package.

FIG. 9 is a schematic cross-sectional view illustrating an example of a fan-out semiconductor package.

Figure 10:
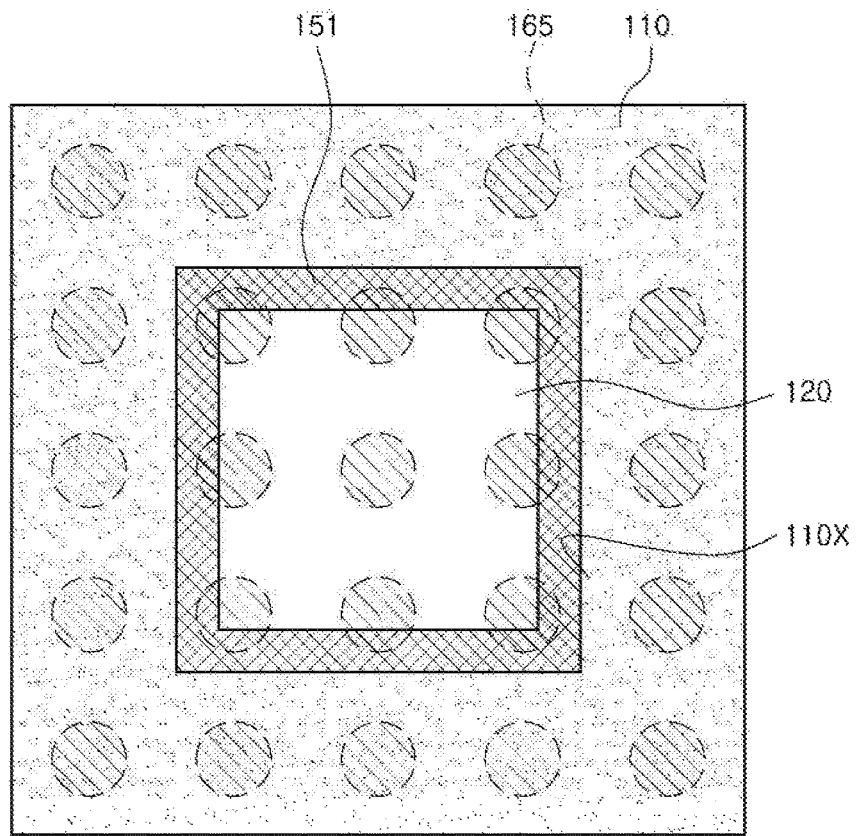
FIG. 10 is a schematic cross-sectional plan view taken along line I-I' of FIG. 9.

FIG. 10 is a schematic cross-sectional plan view taken along line I-I' of FIG. 9.

Referring to FIGS. 9 and 10, a fan-out semiconductor package 100A according to an exemplary embodiment includes a frame 110 having a through hole 110X, a semiconductor chip 120 disposed in the through hole 110X, a first encapsulant 151 disposed in a space between the frame 110 and the semiconductor chip 120, a second encapsulant 152 disposed on upper sides of the frame 110 and the semiconductor chip 120, and a redistribution layer 130 disposed on lower sides of the frame 110 and the semiconductor chip 120. The first and second encapsulants 151 and 152 include different materials.

A common semiconductor package has adopted a structure of merely encapsulating the periphery of a semiconductor chip with an encapsulant, such as an epoxy molding compound (EMC). A redistribution layer is formed on lower sides of the semiconductor chip and the encapsulant to implement redistribution of the semiconductor chip. However, when the periphery of the semiconductor chip is simply covered by the encapsulant, there are limitations on fixing the semiconductor chip, and control of warpage of the common semiconductor package that may occur due to various causes is difficult, resulting in various side effects that may occur in a manufacturing process of the fan-out semiconductor package.

By contrast, as in the fan-out semiconductor package 100A according to an exemplary embodiment, when the frame 110 is provided in a region in which the semiconductor chip 120 is encapsulated and the semiconductor chip 120 is encapsulated with the first and second encapsulants 151 and 152 including different materials, the fan-out semiconductor package 100A may be fundamentally increased in rigidity by the frame 110. In addition, the first encapsulant 151 may allow stress that may occur in a semiconductor chip to be reduced, adhesive strength to be increased, and filling properties to be improved. Further, the second encapsulant 152 may allow a semiconductor chip to be firmly secured, thus significantly reducing unit warpage. Thus, various side effects that may occur in the manufacturing process may be adequately controlled.

The respective components of the fan-out semiconductor package 100A according to an exemplary embodiment will hereinafter be described in more detail.

The frame 110 provides rigidity to the fan-out semiconductor package 100A, which may allow rigidity to be maintained, and thickness uniformity thereof to be secured. The frame 110 also provides a wider routing region. The frame 110 has an upper surface 110A and a lower surface 110B opposing the upper surface 110A. The through hole 110X is formed in a space between the upper and lower surfaces 110A and 110B. The semiconductor chip 120 is spaced apart from the frame 110 at a certain distance in the through hole 110X, resulting in the periphery of the semiconductor chip 120 being surrounded by the frame 110.

A material of the frame 110 is not particularly limited as long as the material may support the fan-out semiconductor package 100A. For example, an insulating material may be used. The insulating material may be a thermosetting resin such as an epoxy resin, a thermoplastic resin such as a polyimid, or a resin, in which the thermosetting resin and the thermoplastic resin are impregnated with a stiffener such as a glass fiber or an inorganic filler, such as a pre-preg (PPG), an Ajinomoto build-up film (ABF), an FR-4 resin, a bismaleimide triazine (BT) resin, or the like. Among these resins, the PPG is preferably used. For example, a copper clad laminate (CCL) or an unclad CCL is preferably used, but the insulating material is not limited thereto. Alternatively, a metal having excellent rigidity and thermal conductivity is used. The metal may be an Fe—Ni-based alloy. A copper (Cu) plating layer is also formed on a surface of the Fe—Ni-based alloy to secure adhesive strength between the Fe—Ni-based alloy, and a molding material or an interlayer insulating material. In addition, glass, ceramic, plastic, or the like, may also be used.

A thickness of a cross section of the frame 110 is not particularly limited, and designed according to a thickness of a cross section of the semiconductor chip 120. For example, according to a type of the semiconductor chip 120, the thickness of the cross section of the frame 110 ranges from about 100 μm to about 500 μm.

The semiconductor chip 120 may be an integrated circuit (IC) provided as an amount of several hundreds to several millions of elements or more integrated in a single chip. If necessary, the semiconductor chip 120 may also have an IC packaged in flip chip form. The IC may be, for example, an application processor chip such as a central processor (for example, a CPU), a graphics processor (for example, a GPU), a digital signal processor, a cryptographic processor, a microprocessor, a microcontroller, or the like, but is not limited thereto.

The semiconductor chip 120 includes an electrode pad 120P electrically connected to the redistribution layer 130. The electrode pad 120P electrically connects the semiconductor chip 120 to an external power source, and formed of a conductive material without particular limits. The conductive material may be copper (Cu), aluminum (Al), silver (Ag), tin (Sn), gold (Au), nickel (Ni), lead (Pb), titanium (Ti), or alloys thereof, but is not limited thereto. The electrode pad 120P is redistributed by the redistribution layer 130. The electrode pad 120P is embedded or protrudes.

When the semiconductor chip 120 is an IC, the semiconductor chip 120 has a body (not illustrated), a passivation layer (not illustrated), and the electrode pad 120P. The body is formed on the basis of, for example, an active wafer. A base material of the body may be silicon (Si), germanium (Ge), gallium arsenide (GaAs), or the like. The passivation layer serves to externally protect the body, and may be formed of, for example, an oxide layer or a nitride layer, or also formed of a double layer of an oxide layer and a nitride layer. A material of the electrode pad 120P may be a conductive material such as copper (Cu), aluminum (Al), silver (Ag), tin (Sn), gold (Au), nickel (Ni), lead (Pb), titanium (Ti), or alloys thereof. A surface on which the electrode pad 120P is formed as an active layer.

The thickness of the cross section of the semiconductor chip 120 is not particularly limited, and varies according to a type of the semiconductor chip 120. For example, when a semiconductor chip is an IC, the thickness of the cross section of the semiconductor chip 120 ranges from about 100 μm to about 480 μm, but is not limited thereto. The thickness of the cross section of the semiconductor chip 120 is equal to or lower than the thickness of the cross section of the frame 110. In this case, protection of the semiconductor chip 120 is easier.

The redistribution layer 130 redistributes the electrode pad 120P of the semiconductor chip 120. Several tens to several hundreds of electrode pads 120P having various functions are redistributed by the redistribution layer 130, and physically or electrically connected to an external power source by a first connection terminal 165 to be described below, according to the functions. The redistribution layer 130 includes a first insulating layer 131, a first wiring pattern 132 disposed on the first insulating layer 131, and a first via 133 passing through the first insulating layer 131. The fan-out semiconductor package 100A according to an exemplary embodiment has the redistribution layer 130 including a single layer, but the redistribution layer 130 is not limited thereto. The redistribution layer 130 also includes a plurality of redistribution layers as described below.

A material of the first insulating material 131 may be an insulating material. The insulating material may be the abovementioned insulating material, or may also be a photoimageable dielectric (PID) resin. When a PID material such as the PID resin is used, the first insulating layer 131 may be formed to have a further reduced thickness, and a fine pitch may be easily implemented. Also, a thickness of the first insulating layer 131 is not particularly limited. For example, the thickness of the first insulating layer 131 except for the first wiring pattern 132 ranges from about 5 μm to about 20 μm, and considering a thickness of the first wiring pattern 132, ranges about 15 μm to about 70 μm.

The first wiring pattern 132 serves as a redistribution line. A material of the first wiring pattern 132 may be a conductive material such as copper (Cu), aluminum (Al), silver (Ag), tin (Sn), gold (Au), nickel (Ni), lead (Pb), titanium (Ti), or alloys thereof. The first wiring pattern 132 and a first wiring pattern 142 (refer to FIG. 15) perform various functions depending on designs of their corresponding layers. For example, each of the first wiring patterns 132 and 142 serve as a ground (GND) pattern, a power (PWR) pattern, a signal (S) pattern, or the like. In this example, the S pattern includes various signals except for a GND pattern, a PWR pattern, or the like, for example, data signals, or the like. In addition, each of the first wiring patterns 132 and 142 serve as a via pad, a connection terminal pad, or the like. A thickness of the first wiring pattern 132 is not particularly limited, and ranges, for example, from about 10 μm to about 50 μm.

An exposed portion of the first wiring pattern 132 may further have a surface treatment layer formed thereon, if necessary. The surface treatment layer is not particularly limited as long as it is known in the related art, and is formed by, for example, electrolytic gold plating, electroless gold plating, organic solderability preservative (OSP) or electroless tin plating, electroless silver plating, electroless nickel plating/substituted gold plating, direct immersion gold (DIG) plating, hot air solder leveling (HASL), or the like.

The first via 133 electrically connects the first wiring pattern 132, the electrode pad 120P, or the like, formed in different layers, resulting in forming an electrical path in the fan-out semiconductor package 100A. A material of the first via 133 may also be a conductive material such as copper (Cu), aluminum (Al), silver (Ag), tin (Sn), gold (Au), nickel (Ni), lead (Pb), titanium (Ti), or alloys thereof. The first via 133 is also fully filled with the conductive material, or the conductive material is also formed along a wall of the first via 133. In addition, the first via 133 may have all shapes known in the related art, such as a tapered shape in which a diameter of the first via 133 is decreased toward a lower surface thereof, a reverse tapered shape in which the diameter is increased toward the lower surface, a cylindrical shape, and the like.

The first encapsulant 151 may protect the semiconductor chip 120, and may reduce stress that may occur in the semiconductor chip 120. The first encapsulant 151 may also prevent a defect caused by a degradation in filling properties for a space of the through hole 110X. The first encapsulant 151 may also prevent a defect due to a reduction in the adhesive strength thereof. The first encapsulant 151 is disposed in the space between the frame 110 and the semiconductor chip 120. For example, the first encapsulant 151 fills the space between the frame 110 and the semiconductor chip 120 in the through hole 110X. Thus, the first encapsulant 151 may serve to secure the semiconductor chip 120 and reduce buckling of the semiconductor chip 120. A certain material of the first encapsulant 151 is not particularly limited. For example, the certain material may be an insulating material. The insulating material may be a thermosetting resin such as an epoxy resin, a thermoplastic resin such as a polyimid, or a resin, in which the thermosetting resin and the thermoplastic resin are impregnated with a stiffener such as an inorganic filler, such as an ABF.

FIG. 9 illustrates the first encapsulant 151 including a single layer. However, the first encapsulant 151 is not limited thereto, and also includes a plurality of layers. An interval of the space of the through hole 110X filled with the first encapsulant 151 is not particularly limited, and may be optimized by a person skilled in the art. For example, the interval ranges from about 10 μm to about 150 μm, but is not limited thereto.

The second encapsulant 152 may protect the semiconductor chip 120, and may firmly secure the semiconductor chip 120. The second encapsulant 152 may also provide rigidity to the fan-out semiconductor package 100A to thus significantly reduce unit warpage thereof. The second encapsulant 152 is disposed on upper sides of the frame 110 and the semiconductor chip 120. For example, the second encapsulant 152 covers an upper side of the first encapsulant 151 and the upper sides of the frame 110 and the semiconductor chip 120. Thus, the second encapsulant 152 may serve to firmly secure the semiconductor chip 120 while protecting the semiconductor chip 120 and to significantly reduce unit warpage thereof when having a high degree of rigidity. In this example, the term "cover" does not mean that a component needs to be in direct contact with a reference component. A certain material of the second encapsulant 152 is not particularly limited. For example, the certain material may be an insulating material. The insulating material may be a thermosetting resin such as an epoxy resin, a thermoplastic resin such as a polyimid, or a resin, in which the thermosetting resin and the thermoplastic resin are impregnated with a stiffener such as an inorganic filler, such as an ABF. As described above or below, a material different to the first encapsulant 151 is selectively used to form the second encapsulant 152, considering a relative relationship between properties of the material and the first encapsulant 151.

FIG. 9 illustrates the second encapsulant 152 including a single layer. However, the second encapsulant 152 is not limited thereto, and also includes a plurality of layers. A thickness of the second encapsulant 152 is not particularly limited, and may be optimized by a person skilled in the art. For example, the thickness ranges from about 15 μm to about 150 μm, but is not limited thereto.

A material for forming the first encapsulant 151 has a lower viscosity than a material for forming the second encapsulant 152. As the viscosity of the material for forming the first encapsulant 151 is relatively reduced, filling properties of the material for forming the first encapsulant 151 are increased when the space of the through hole 110X is filled with the material for forming the first encapsulant 151. By contrast, when the viscosity of the material for forming the first encapsulant 151 is relatively increased, a degradation in the filling properties may cause a void. Viscosity is specified using a common viscometer.

The first encapsulant 151 is increased in adhesive strength with respect to the semiconductor chip 120 than the second encapsulant 152. As the adhesive strength of the first encapsulant 151 disposed in the space between the frame 110 and the semiconductor chip 120 in the through hole 110X is relatively increased, the semiconductor chip 120 is stably disposed without delimination or the like. Adhesive strength is measured using a known adhesive strength measuring device.

The first encapsulant 151 has a lower modulus of elasticity than the second encapsulant 152. The first and second encapsulants 151 and 152 have lower moduli of elasticity than the frame 110. As the modulus of elasticity of the first encapsulant 151 is relatively reduced, excellent buckling effects with respect to the semiconductor chip 120 are obtained. As the modulus of elasticity of the second encapsulant 152 is relatively increased, rigidity thereof is excellent. The second encapsulant 152 is disposed on an upper side of the fan-out semiconductor package 100A to significantly reduce unit warpage thereof. The modulus of elasticity is a ratio of stress to deformation, and is measured by a measurement method, for example, the standard tension test specified in JIS C-6481, KS M 3001, KS M 527-3, or ASTM D882.

The first encapsulant 151 has a coefficient of thermal expansion greater than that of the second encapsulant 152. The first encapsulant 151 is formed prior to formation of the second encapsulant 152. Thus, as the coefficient of thermal expansion of the first encapsulant 151 is relatively increased, various side effects that may occur in a process of forming the second encapsulant 152, a follow-up process, may be reduced. Further, as the coefficient of thermal expansion of the second encapsulant 152 holding the upper side of the fan-out semiconductor package 100A is relatively reduced, deformation thereof may be significantly reduced, and unit warpage may be significantly decreased. A coefficient of thermal expansion is measured by a thermo mechanical analyzer (TMA) or a dynamic mechanical analyzer (DMA).

The first encapsulant 151 has a higher glass transition temperature than the second encapsulant 152. According to glass transition temperatures, a range of properties of matter, such as a modulus of elasticity or a coefficient of thermal expansion, varies. In general, as a glass transition temperature is increased, a modulus of elasticity is reduced, and a coefficient of thermal expansion is increased. A glass transition temperature is measured using a differential scanning calorimeter (DSC) or the like.

The fan-out semiconductor package 100A according to an exemplary embodiment further includes a first passivation layer 160 disposed on a lower side of the redistribution layer 130. The first passivation layer 160 protects the redistribution layer 130 from external physical or chemical damage. The first passivation layer 160 has a first opening 161 exposing at least a portion of the first wiring pattern 132 of the redistribution layer 130. The first opening 161 exposes a surface of the at least the portion of the first wiring pattern 132, and also exposes a side surface of the at least the portion, if necessary.

A material of the first passivation layer 160 is not particularly limited, and may be, for example, a solder resist. In addition, the same material as the first insulating layer 131 of the redistribution layer 130, for example, the same PID resin, is also used. The first passivation layer 160 generally includes a single layer, but may also include a plurality of layers, if necessary.

The fan-out semiconductor package 100A according to an exemplary embodiment further includes the first connection terminal 165 externally exposed through a lower side of the first passivation layer 160. The first connection terminal 165 physically or electrically connects the fan-out semiconductor package 100A to an external power source. For example, the fan-out semiconductor package 100A is mounted on a main board of an electronic device by the first connection terminal 165. The first connection terminal 165 is disposed in the first opening 161, and connected to the first wiring pattern 132 exposed by the first opening 161. This causes the first connection terminal 165 to be electrically connected to the semiconductor chip 120.

The first connection terminal 165 is formed of a conductive material such as copper (Cu), aluminum (Al), silver (Ag), tin (Sn), gold (Au), nickel (Ni), lead (Pb), titanium (Ti), a solder, or the like. However, the conductive material is only an example, but not particularly limited thereto. The first connection terminal 165 may be a land, a ball, a pin, or the like. The first connection terminal 165 includes a single layer or a plurality of layers. When the first connection terminal 165 includes the plurality of layers, the first connection terminal 165 includes a copper pillar and a solder. When the connection terminal 165 includes the single layer, the first connection terminal 165 includes a tin-silver solder or copper. However, the first connection terminal 165 is only an example, and not limited thereto.

At least one of first connection terminals 165 is disposed in a fan-out region. The fan-out region defines a region outside of a region in which a semiconductor chip is disposed. For example, the fan-out semiconductor package 100A according to an exemplary embodiment is a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a reduced thickness, and may have excellent price competitiveness.

The number, interval, disposition, or the like, of the first connection terminal 165 is not particularly limited, and may be sufficiently modified by a person skilled in the art depending on design particulars. For example, the number of first connection terminals 165 may be provided in an amount of several tens to several thousands according to the number of electrode pads 120P of the semiconductor chip 120, but is not limited thereto, and may also be provided in an amount not less than or not more than several tens to several thousands.

FIG. 11A through 11E are schematic views illustrating an example of a process of manufacturing the fan-out semiconductor package of FIG. 9.

Figure 11A:
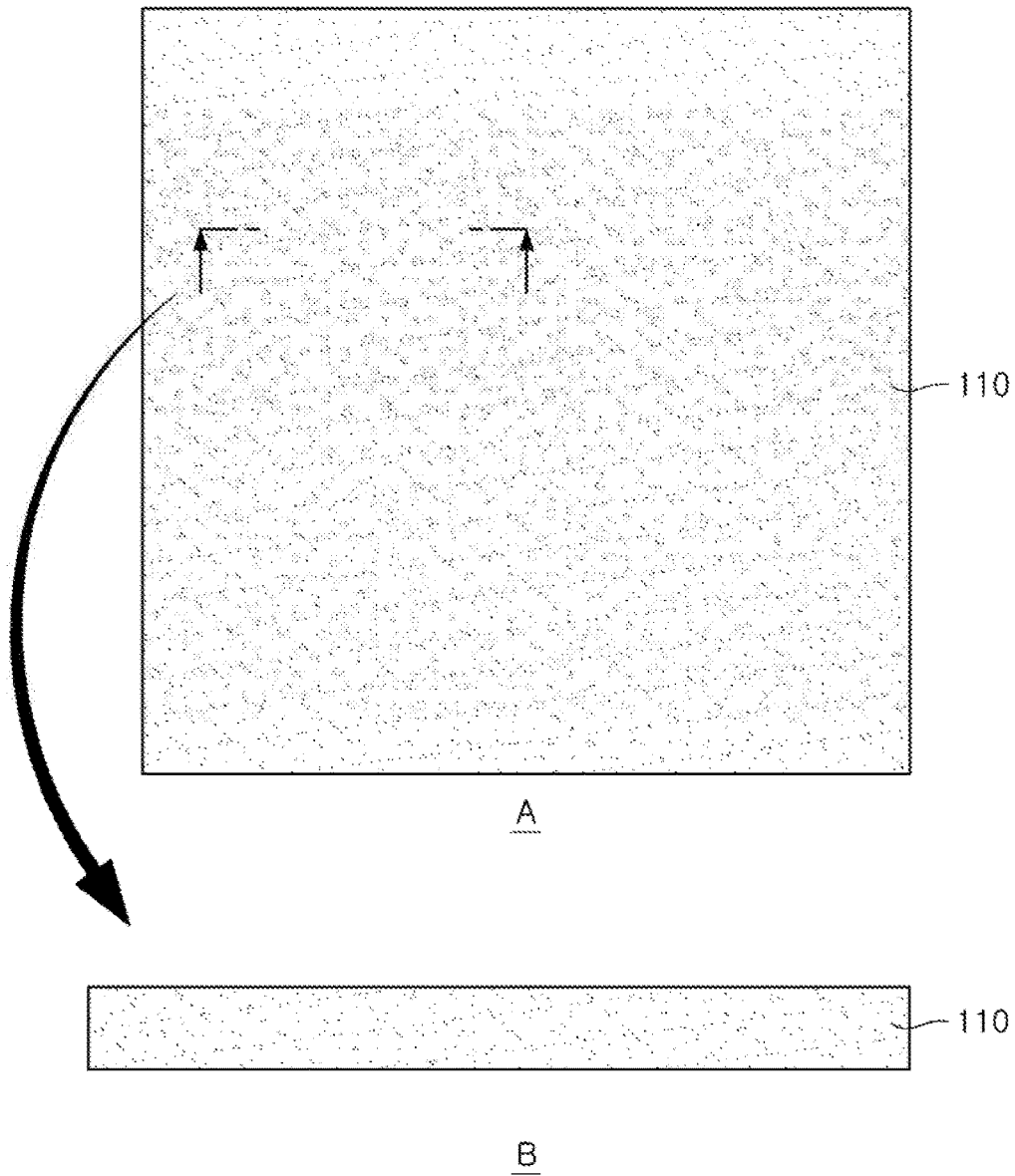
FIGS. 11A through 11E are schematic views illustrating an example of a process of manufacturing the fan-out semiconductor package of FIG. 9.

Referring to FIG. 11A, the frame 110 is prepared. In this example, A is a plan view of the frame 110, and B illustrates a cross section of a region of A, which may be utilized as a unit package. The frame 110 is manufactured and utilized in various sizes to facilitate mass production thereof. For example, a large-sized frame 110 is prepared, and a plurality of semiconductor packages 100 are then manufactured in processes to be described below. Subsequently, the fan-out semiconductor packages 100 are singulated into individual packages by a sawing process or the like. The frame 110 may have a fiducial mark for excellent pick-and-place (P&P), which allows the semiconductor chip 120 to be mounted on a clearer location, resulting in an increase in completeness of production. In addition, contents overlapping with contents above will be omitted.

Figure 11B:
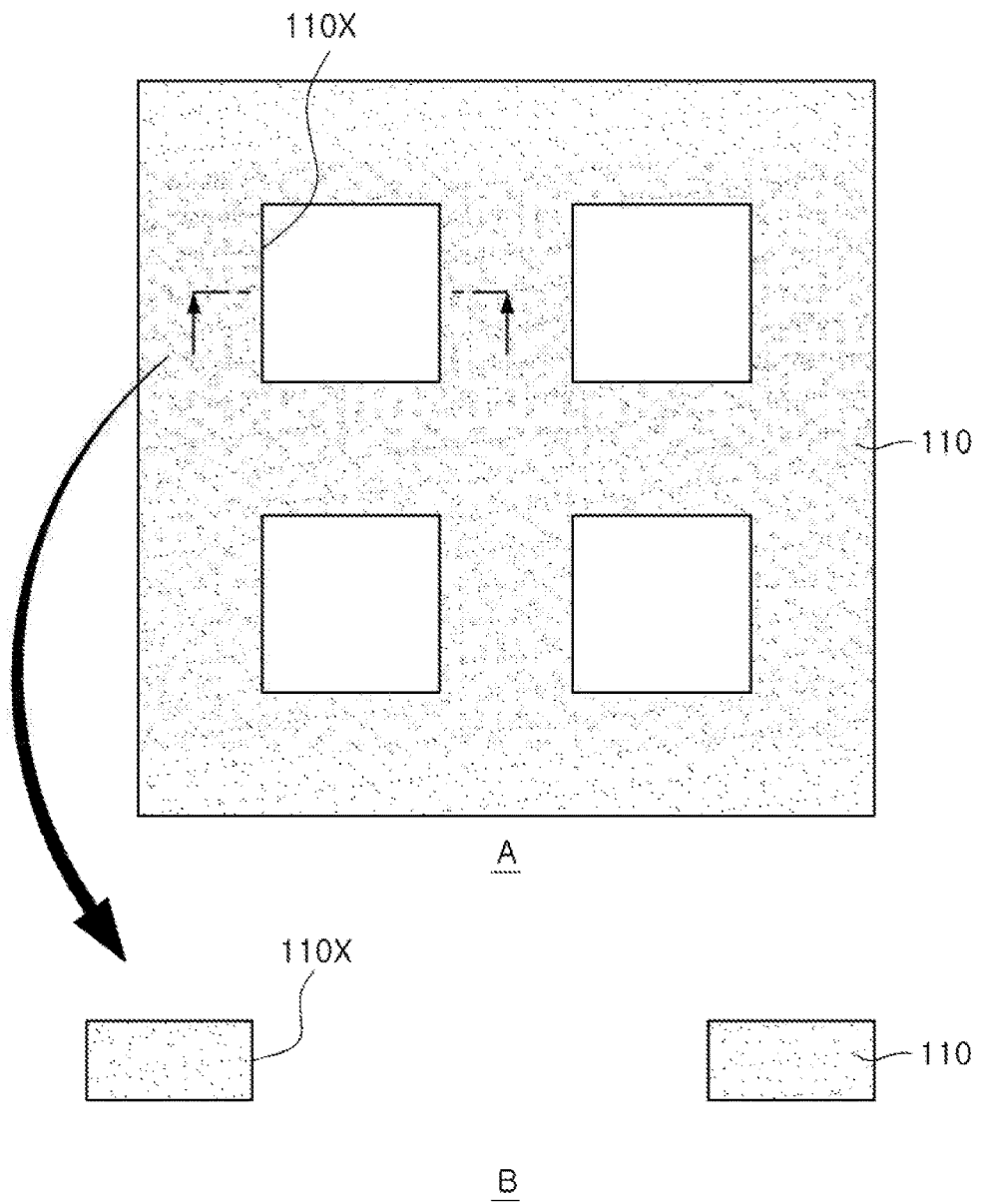

Referring to FIG. 11B, the through hole 110X passing through the frame 110 is formed. In this example, A is a plan view of the frame 110 in which the through hole 110X is formed, and B illustrates a cross section of a region of A, which may be utilized as a unit package. A method of forming the through hole 110X is not particularly limited, and is also performed using, for example, a mechanical drilling method or a laser drilling method, a sand blasting method using particles for grinding, or a dry etching method using plasma. When the through hole 110X is formed using the mechanical drilling method or the laser drilling method, the through hole 110X is subject to a desmearing treatment, such as a permanganate method, to remove resin smear in the through hole 110X. A size or shape of the through hole 110X is determined according to a size or shape of the semiconductor chip 120 to be mounted therein, or to the number of semiconductor chips 120. In addition, contents overlapping with contents above will be omitted.

Figure 11C:
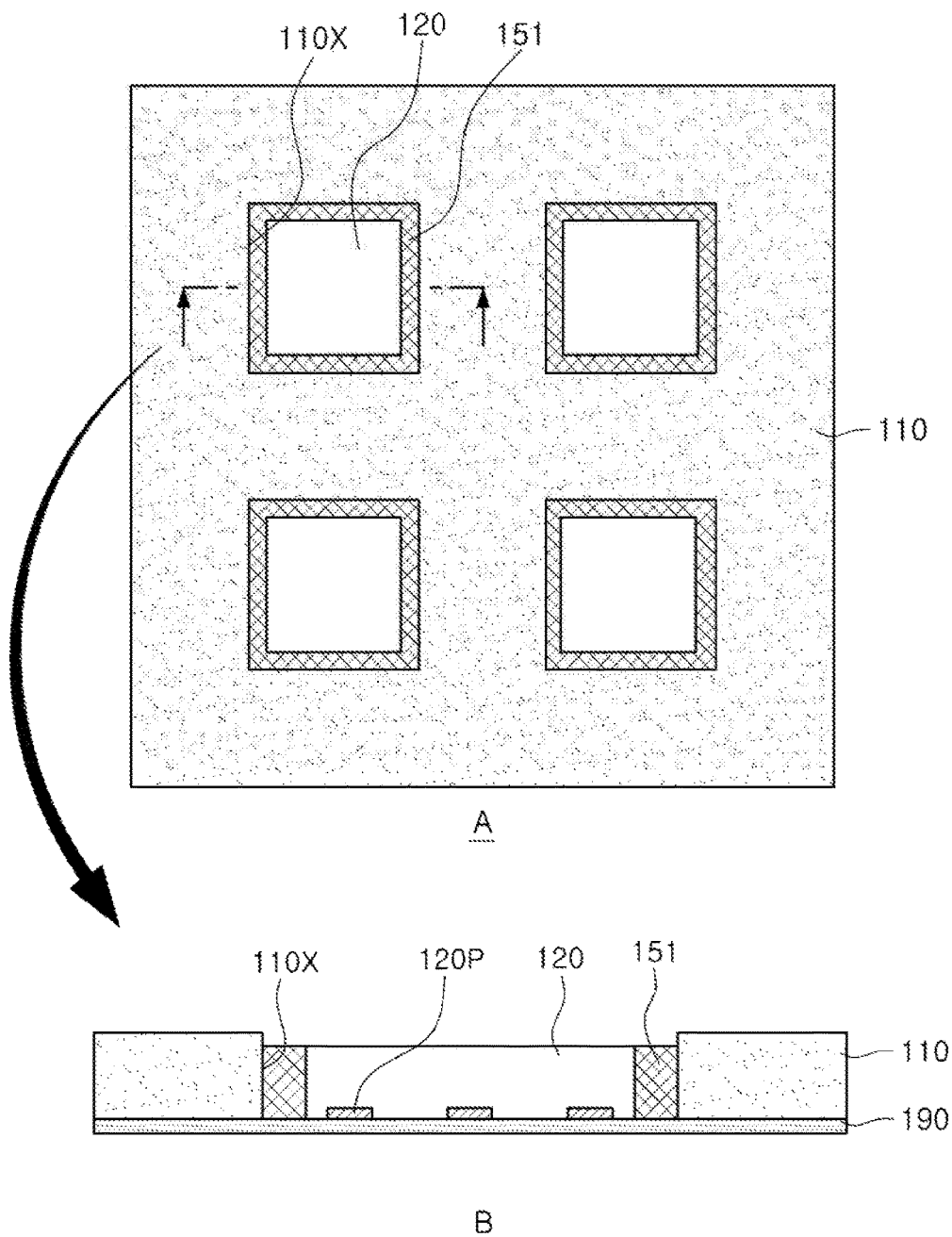

Referring to FIG. 11C, a bonding film 190 is bonded to a lower surface of the frame 110. Then, the semiconductor chip 120 is disposed in the through hole 110X. Subsequently, the space between the frame 110 and the semiconductor chip 120 in the through hole 110X is filled with the first encapsulant 151. In this example, A is a plan view of the frame 110 in which the semiconductor chip 120 is disposed and the first encapsulant 151 is provided, and B illustrates a cross section of a region of A, which may be utilized as a unit package. The semiconductor chip 120 is disposed in face-down form such that the electrode pad 120P faces downwardly. The first encapsulant 151 is formed by a known method, for example, by laminating and curing a first encapsulant precursor. Alternatively, the first encapsulant 151 is formed by applying and curing an encapsulant. By the curing, the first encapsulant 151 secures the semiconductor chip 120. Thus, a movement of the semiconductor chip 120 in a follow-up process may be significantly reduced. A laminating method may be, for example, a method of hot pressing a precursor, cooling the hot pressed precursor using a cold press, and separating a tool from the cooled precursor, or the like, the hot pressing including pressurizing the precursor at high temperatures for a certain period of time, depressurizing the pressurized precursor, and cooling the depressurized precursor to room temperature. An application method may be, for example, a screen printing method of applying ink with a squeegee, a spray printing method of misting and applying ink, or the like. In addition, contents overlapping with contents above will be omitted.

Figure 11D:
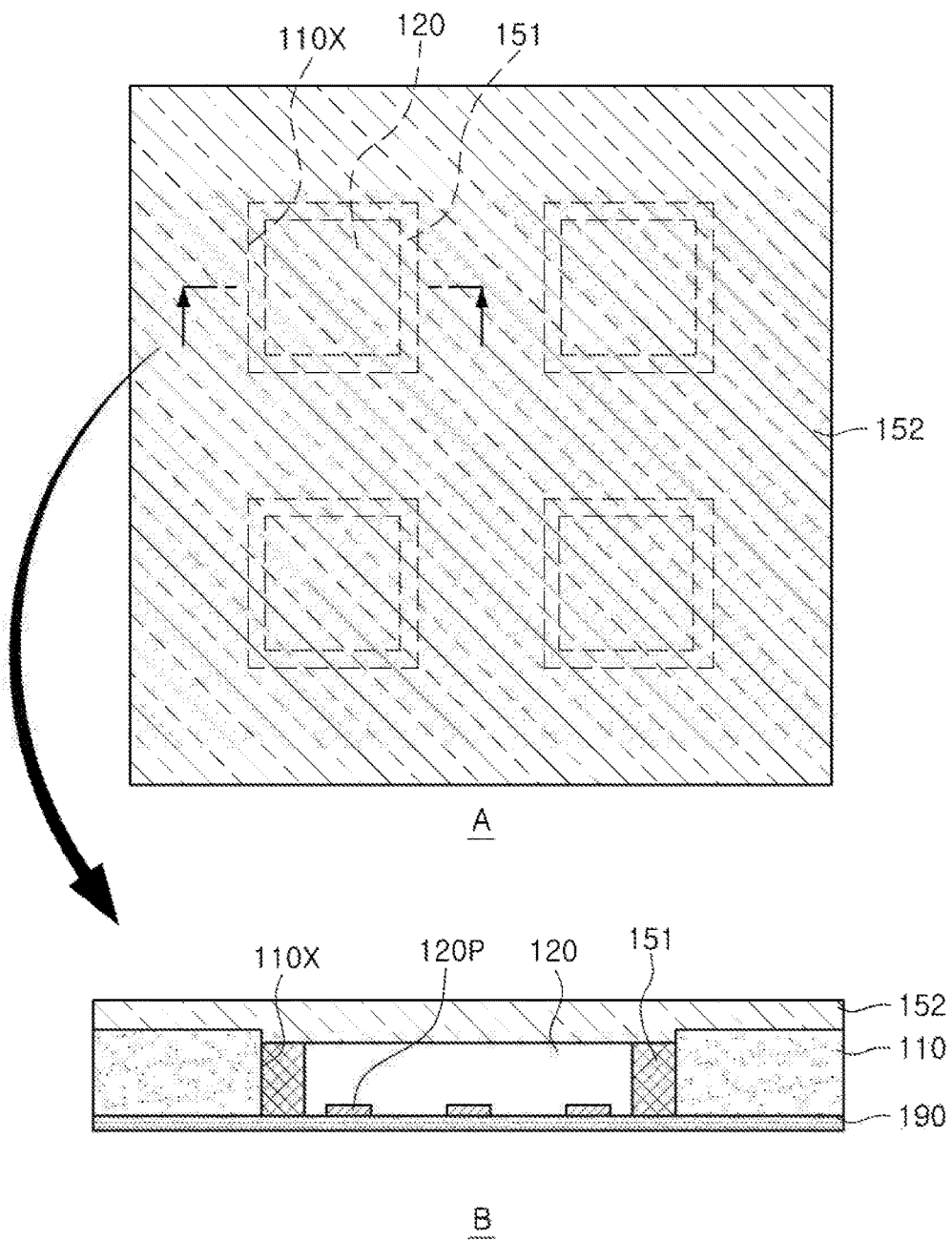

Referring to FIG. 11D, the second encapsulant 152 is formed on the upper sides of the first encapsulant 151, the frame 110, and the semiconductor chip 120. In this example, A is a plan view of the frame 110 in which the second encapsulant 152 is formed, and B illustrates a cross section of a region of A, which may be utilized as a unit package. The second encapsulant 152 is formed by a known method, for example, by laminating and curing a second encapsulant precursor. Alternatively, the second encapsulant 152 is formed by applying and curing an encapsulant. By the curing, the second encapsulant 152 secures the semiconductor chip 120. Thus, a movement of the semiconductor chip 120 in a follow-up process may be significantly reduced. A laminating method may be, for example, a method of hot pressing a precursor, cooling the hot pressed precursor using a cold press, and separating a tool from the cooled precursor, or the like, the hot pressing including pressurizing the precursor at high temperatures for a certain period of time, depressurizing the pressurized precursor, and cooling the depressurized precursor to room temperature. An application method may be, for example, a screen printing method of applying ink with a squeegee, a spray printing method of misting and applying ink, or the like. In addition, contents overlapping with contents above will be omitted.

Figure 11E:
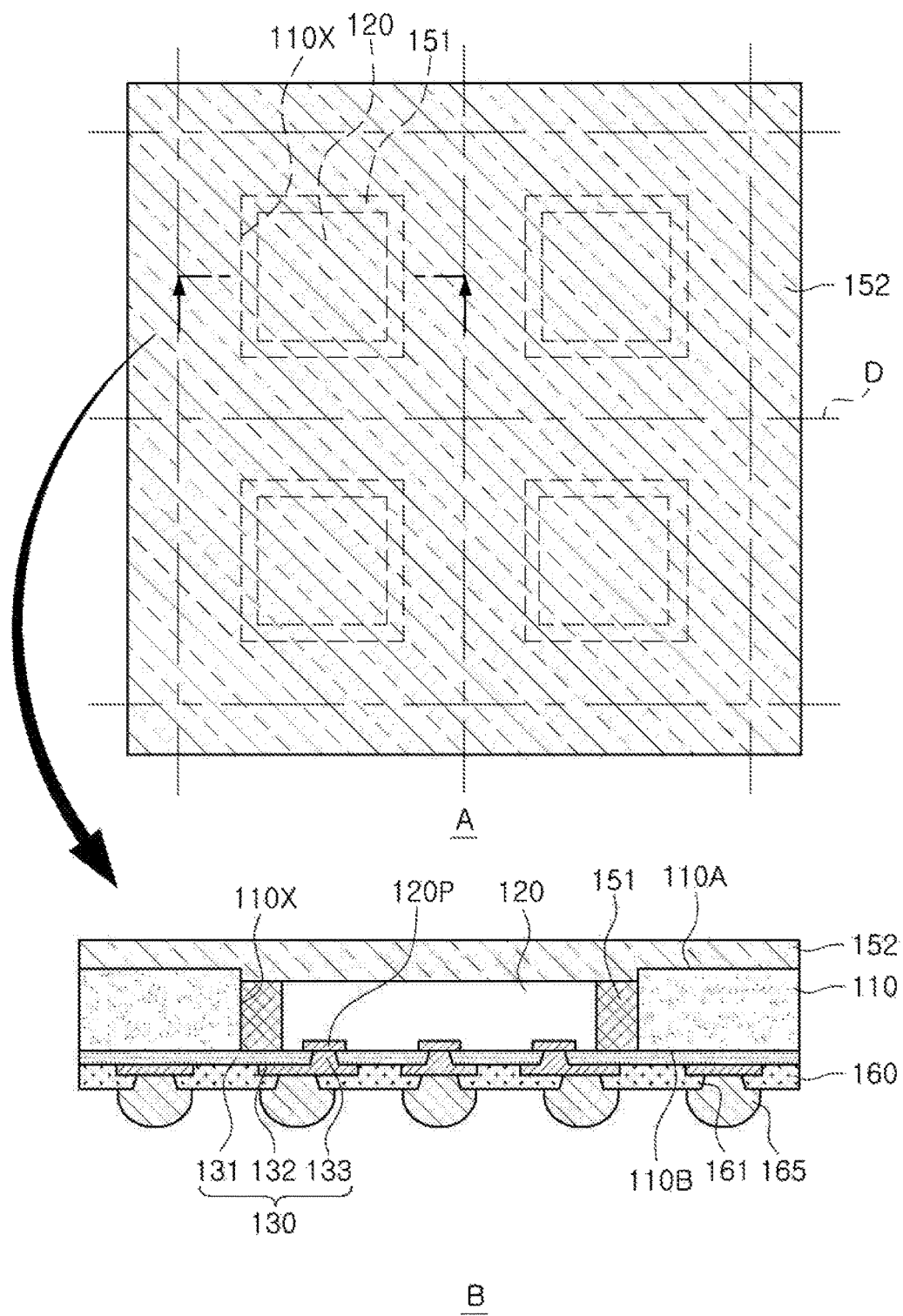

Referring to FIG. 11E, after removing the bonding film 190, the redistribution layer 130 is formed on the lower sides of the frame 110 and the semiconductor chip 120. After the formation of the redistribution layer 130, the first passivation layer 160 is formed on the lower side thereof. Then, the first opening 161 is formed in the first passivation layer 160 such that at least a portion of the first wiring pattern 132 is exposed. The first opening 161 is formed in the first passivation layer 160, and the first connection terminal 165 disposed in the first opening 161 is then formed. In addition, a singulation process is performed along a cutting line D. In this example, A is a plan view of the frame 110 in which the redistribution layer 130, the first passivation layer 160, or the like, is formed, and B illustrates a cross section of a region of A, which may be utilized as a unit package. A method of forming the first insulating layer 131 may be a known method. For example, the first insulating layer 131 is formed using a method of laminating and curing an insulating layer, a method of applying and curing an insulating layer, or the like, but is not limited thereto. A laminating method may be, for example, a method of hot pressing an insulating layer, cooling the hot pressed insulating layer using a cold press, and separating a tool from the cooled insulating layer, or the like, the hot pressing including pressurizing the insulating layer at high temperatures for a certain period of time, depressurizing the pressurized insulating layer, and cooling the depressurized insulating layer to room temperature. An application method may be, for example, a screen printing method of applying ink with a squeegee, a spray printing method of misting and applying ink, or the like. The curing may be drying an insulating layer so as not to be fully cured in order to use a photolithography method, or the like, as a subsequent process. A method of forming the first wiring pattern 132 and the first via 133 may also be a known method. First, a via hole (not illustrated) is formed using the abovementioned mechanical drilling method or laser drilling method. When the first insulating layer 131 includes a PID resin, or the like, the via hole may even be formed using a photolithography method. The first wiring pattern 132 and the first via 133 are formed using a dry film pattern, and electro copper plating or electroless copper plating. The first passivation layer 160 is formed by a method of laminating and curing a first passivation layer 160 precursor, a method of applying and curing a first passivation layer 160 formation material, or the like. The first opening 161 may be formed using a mechanical drilling method or a laser drilling method, and may also be formed using a photolithography method. A method of forming the first connection terminal 165 is not particularly formed, and is formed by a method well known in the related art according to a structure or shape of the first connection terminal 165. The first connection terminal 165 is secured by reflow, a portion of the first connection terminal 165 is embedded in the first passivation layer 160, and the remainder of the first passivation layer 160 is externally exposed to strengthen securing force, thus increasing reliability. The singulation process may be a known method, for example, a sawing process, or the like. The cutting line D is temporarily illustrated, and varies according to the size of the fan-out semiconductor package 100A desired to be manufactured, or the like. In some cases, a recess is also formed up to the first opening 161.

Figure 12:
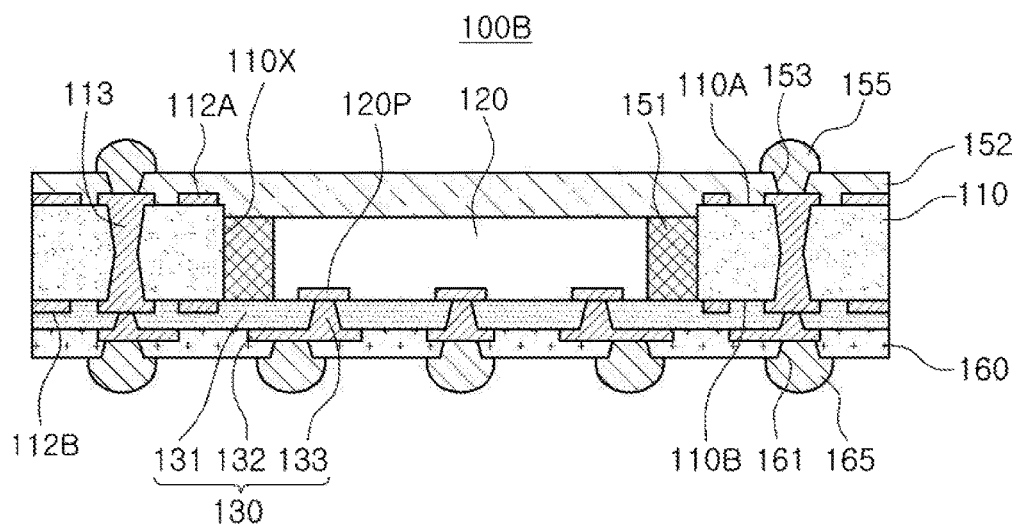
FIG. 12 is a schematic cross-sectional view illustrating another example of a fan-out semiconductor package.

FIG. 12 is a schematic cross-sectional view illustrating another example of a fan-out semiconductor package.

Referring to FIG. 12, a fan-out semiconductor package 100B according to another exemplary embodiment further includes a through wiring 113 passing through a frame 110, and a second wiring pattern 112A and a third wiring pattern 112B disposed on an upper surface 110A and a lower surface 110B of the frame 110. Hereinafter, each component included in the fan-out semiconductor package 100B according to another exemplary embodiment will be described in more detail, and contents overlapping with contents above will be omitted, and only differences therebetween will be described.

The through wiring 113 passing through the upper surface 110A and the lower surface 110B serves to electrically connect wiring patterns disposed on different layers. A material of the through wiring 113 may be a conductive material such as copper (Cu), aluminum (Al), silver (Ag), tin (Sn), gold (Au), nickel (Ni), lead (Pb), titanium (Ti), or alloys thereof. The through wiring 113 enables upper and lower sides of a semiconductor chip 120 to be electrically connected through right and left sides of the semiconductor chip 120, thus significantly increasing spatial utilization, and a connection of the through wiring 113 in a 3D structure allows the fan-out semiconductor package 100B to apply to a package on package (PoP) structure or the like, thus extending the application of the fan-out semiconductor package 100B to present various modules and package application products. The through wiring 113 is connected to one serving as a pad of the through wiring 113 among the second and third wiring patterns 112A and 112B. The number of through wirings 113, or an interval, a disposition, or the like, of the through wirings 113 is not particularly limited, and may be sufficiently modified by a person skilled in the art depending on design particulars. When a material of the frame 110 is a metal, for example, an Fe—Ni-based alloy or the like, an insulating material is disposed in a space between the metal and the through wiring 113 or between the second and third wiring patterns 112A and 112B to be electrically insulated from the through wiring 113 or the second and third wiring patterns 112A and 112B.

The second and third wiring patterns 112A and 112B also serve as redistribution lines. Materials of the second and third wiring patterns 112A and 112B may be conductive materials such as copper (Cu), aluminum (Al), silver (Ag), tin (Sn), gold (Au), nickel (Ni), lead (Pb), titanium (Ti), or alloys thereof. The second and third wiring patterns 112A and 112B perform various functions depending on designs of their corresponding layers. For example, the second and third wiring patterns 112A and 112B serve as a GND pattern, a PWR pattern, an S pattern, a bond finger (BF) pattern, or the like. In this example, the S pattern includes various signals except for a GND pattern, a PWR pattern, a BF pattern, or the like, for example, data signals, or the like. In addition, the second and third wiring patterns 112A and 112B serve as a via pad, a through wiring pad, a connection terminal pad, or the like. A thickness of each of the second and third wiring patterns 112A and 112B is not particularly limited, and ranges, for example, from about 10 μm to about 50 μm. The second and third wiring patterns 112A and 112B may be dummy patterns that do not perform redistribution functions.

The fan-out semiconductor package 100B according to another exemplary embodiment has a second opening 153 exposing at least a portion of the second wiring pattern 112A disposed on the upper surface 110A of the frame 110 in a second encapsulant 152. The second opening 153 is utilized as a marking for engraving of the fan-out semiconductor package 100B, or the like. Alternatively, the fan-out semiconductor package 100B further includes a second connection terminal 155 disposed in the second opening 153 of the second encapsulant 152. The second connection terminal 155 physically or electrically connects other electronic components or electronic component package on the fan-out semiconductor package 100B to the fan-out semiconductor package 100B. For example, other electronic component packages are mounted on the fan-out semiconductor package 100B by the second connection terminal 155 to form a PoP structure. The second connection terminal 155 is disposed in the second opening 153, and connected to the second wiring pattern 112A exposed by the second opening 153. This causes the second connection terminal 155 to be electrically connected to the semiconductor chip 120.

The second connection terminal 155 is formed of a conductive material, such as copper (Cu), aluminum (Al), silver (Ag), tin (Sn), gold (Au), nickel (Ni), lead (Pb), titanium (Ti), a solder, or the like. However, the conductive material is only an example, but the present disclosure is not limited thereto. The second connection terminal 155 may be a land, a ball, a pin, or the like. The second connection terminal 155 includes a single layer or a plurality of layers. When the second connection terminal 155 includes the plurality of layers, the second connection terminal 155 includes a copper pillar and a solder. When the second connection terminal 155 includes the single layer, the second connection terminal 155 includes a tin-silver solder or copper. However, this is only an example, and the second connection terminal 155 is not limited thereto.

A method of manufacturing the fan-out semiconductor package 100B according to another exemplary embodiment is the same as described above except for previously forming the through wiring 113 in the frame 110, forming the second and third wiring patterns 112A and 112B, or the like, in the abovementioned method of manufacturing the fan-out semiconductor package 100A, and will thus be omitted.

Figure 13:
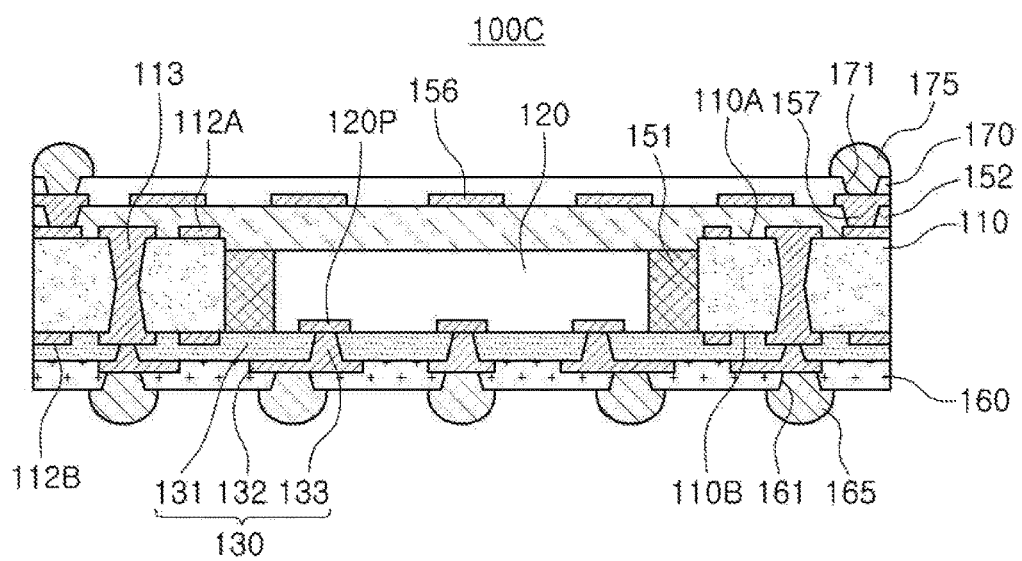
FIG. 13 is a schematic cross-sectional view illustrating another example of a fan-out semiconductor package.

FIG. 13 is a schematic cross-sectional view illustrating another example of a fan-out semiconductor package.

Referring to FIG. 13, a fan-out semiconductor package 100C according to another exemplary embodiment further includes a through wiring 113 passing through a frame 110, a second wiring pattern 112A and a third wiring pattern 112B disposed on an upper surface 110A and a lower surface 110B of the frame 110, a fourth wiring pattern 156 disposed on a second encapsulant 152, and a second via 157 passing through the second encapsulant 152. Hereinafter, each component included in the fan-out semiconductor package 100C according to another exemplary embodiment will be described in more detail, and contents overlapping with contents above will be omitted, and only differences therebetween will be described.

The fourth wiring pattern 156 disposed on the second encapsulant 152 serves as a redistribution line. A material of the fourth wiring pattern 156 may be a conductive material such as copper (Cu), aluminum (Al), silver (Ag), tin (Sn), gold (Au), nickel (Ni), lead (Pb), titanium (Ti), or alloys thereof. A detailed example of the fourth wiring pattern 156 is the same as described above. The fourth wiring pattern 156 performs various functions depending on a design of its corresponding layer. For example, the fourth wiring pattern 156 serves as a GND pattern, a PWR pattern, an S pattern, or the like. In this example, the signal (S) pattern includes various signals except for a GND pattern, a PWR pattern, or the like, for example, data signals, or the like. In addition, the fourth wiring pattern 156 serves as a via pad, a connection terminal pad, or the like. The fourth wiring pattern 156 is disposed on a front surface of the second encapsulant 152, and accordingly, a third connection terminal 175 is also disposed on a front surface of a second passivation layer 170 to be described below, thus enabling a variety of designs. A thickness of the fourth wiring pattern 156 is not particularly limited, and ranges, for example, from about 10 μm to about 50 μm.

The second via 157 passing through a portion of the second encapsulant 152 electrically connects the second wiring pattern 112A and the fourth wiring pattern 156 formed in different layers, resulting in forming an electrical path in the fan-out semiconductor package 100C. A material of the second via 157 may be a conductive material such as copper (Cu), aluminum (Al), silver (Ag), tin (Sn), gold (Au), nickel (Ni), lead (Pb), titanium (Ti), or alloys thereof. The second via 157 is fully filled with the conductive material, or the conductive material is also formed along a wall of the second via 157. In addition, the second via 157 may have all shapes known in the related art, such as a tapered shape in which a diameter of the second via 157 is decreased toward a lower surface thereof, a reverse tapered shape in which the diameter is increased toward the lower surface, a cylindrical shape, and the like.

The fan-out semiconductor package 100C according to another exemplary embodiment further includes the second passivation layer 170 disposed on an upper side of the second encapsulant 152. The second passivation layer 170 protects the second encapsulant 152 or the fourth wiring pattern 156 from external physical or chemical damage. The second passivation layer 170 has a third opening 171 exposing at least a portion of the fourth wiring pattern 156 disposed on the second encapsulant 152. The third opening 171 exposes a surface of the at least the portion of the fourth wiring pattern 156, and also exposes a side surface of the at least the portion, if necessary. The third opening 171 is utilized as a marking for engraving of the fan-out semiconductor package 100C, or the like. A material of the second passivation layer 170 is not particularly limited, and may be, for example, a solder resist. In addition, various types of PID resins are used. The second passivation layer 170 also includes a plurality of layers, if necessary.

The fan-out semiconductor package 100C according to another exemplary embodiment further includes the third connection terminal 175 disposed in the third opening 171 of the second passivation layer 170. The third connection terminal 175 is disposed in the third opening 171, and connected to the fourth wiring pattern 156 exposed by the third opening 171. The third connection terminal 175 is formed of a conductive material, such as copper (Cu), aluminum (Al), silver (Ag), tin (Sn), gold (Au), nickel (Ni), lead (Pb), titanium (Ti), a solder, or the like. However, the conductive material is only an example, but the present disclosure is not limited thereto. The third connection terminal 175 may be a land, a ball, a pin, or the like. The third connection terminal 175 includes a single layer or a plurality of layers. When the third connection terminal 175 includes the plurality of layers, the third connection terminal 175 includes a copper pillar and a solder. When the third connection terminal 175 includes the single layer, the third connection terminal 175 includes a tin-silver solder or copper. However, this is only an example, and the third connection terminal 175 is not limited thereto. If necessary, the third opening 171 also has various separate passive components (not illustrated) disposed therein.

A method of manufacturing the fan-out semiconductor package 100C according to another exemplary embodiment is the same as described above except for forming the fourth wiring pattern 156 and the second via 157, or the like, in the abovementioned method of manufacturing the fan-out semiconductor package 100A, and will thus be omitted.

Figure 14:
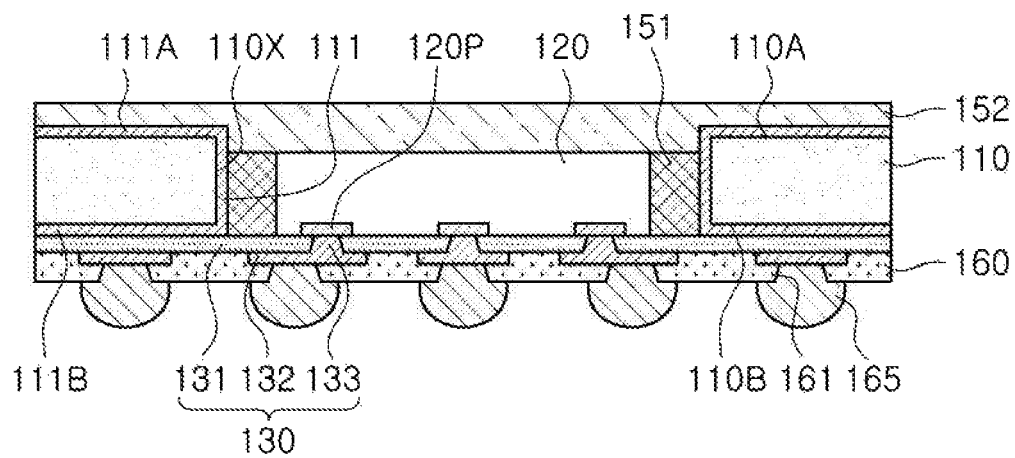
FIG. 14 is a schematic cross-sectional view illustrating another example of a fan-out semiconductor package.

FIG. 14 is a schematic cross-sectional view illustrating another example of a fan-out semiconductor package.

Referring to FIG. 14, a fan-out semiconductor package 100D according to another exemplary embodiment further includes a first metal layer 111 disposed on an inner wall of a through hole 110X, a second metal layer 111A disposed on an upper surface 110A of a frame 11, and a third metal layer 111B disposed on a lower surface 110B of the frame 110. Only the first metal layer 111 allows for excellent heat and electromagnetic wave shielding effects, but the second metal layer 111A and the third metal layer 111B are further disposed to obtain better effects. Hereinafter, each component included in the fan-out semiconductor package 100D according to another exemplary embodiment will be described in more detail, and contents overlapping with contents above will be omitted, and only differences therebetween will be described.

The first metal layer 111 fundamentally diffuses heat generated by a semiconductor chip 120 toward the frame 110 to distribute the heat while blocking electromagnetic waves. The first metal layer 111 is disposed on the inner wall of the through hole 110X to thus surround the periphery of side surfaces of the semiconductor chip 120. The first metal layer 111 entirely covers the inner wall of the through hole 110X, and in this case, heating and electromagnetic wave interference may be controlled more effectively. A material of the first metal layer 111 may be a conductive material such as copper (Cu), aluminum (Al), silver (Ag), tin (Sn), gold (Au), nickel (Ni), lead (Pb), titanium (Ti), or alloys thereof.

The second metal layer 111A diffuses heat transmitted through the first metal layer 111, or the like, to an upper side of the fan-out semiconductor package 100D. In addition, the second metal layer 111A further improves electromagnetic wave shielding effects. The second metal layer 111A is disposed on the upper surface 110A of the frame 110, and in an example, entirely covers the upper surface 110A. Thus, heating and electromagnetic wave interference may be controlled more effectively. A material of the second metal layer 111A may be a conductive material such as copper (Cu), aluminum (Al), silver (Ag), tin (Sn), gold (Au), nickel (Ni), lead (Pb), titanium (Ti), or alloys thereof.

The third metal layer 111B diffuses heat transmitted through the first metal layer 111, or the like, to a lower side of the fan-out semiconductor package 100D. In addition, the third metal layer 111B further improves electromagnetic wave shielding effects. The third metal layer 111B is disposed on the lower surface 110B of the frame 110, and in an example, entirely covers the lower surface 110B. Thus, heating and electromagnetic wave interference may be controlled more effectively. A material of the third metal layer 111B may be a conductive material such as copper (Cu), aluminum (Al), silver (Ag), tin (Sn), gold (Au), nickel (Ni), lead (Pb), titanium (Ti), or alloys thereof.

Unlike illustrated in FIG. 14, the fan-out semiconductor package 100D according to another exemplary embodiment may be modified to have a shape to which the characteristic shapes of the abovementioned semiconductor packages 100B and 100C are applied. In addition, a method of manufacturing the fan-out semiconductor package 100D according to another exemplary embodiment is the same as described above except for forming the first to third metal layers 111, 111A, and 111B, or the like, in the abovementioned method of manufacturing the fan-out semiconductor package 100A, and will thus be omitted.

Figure 15:
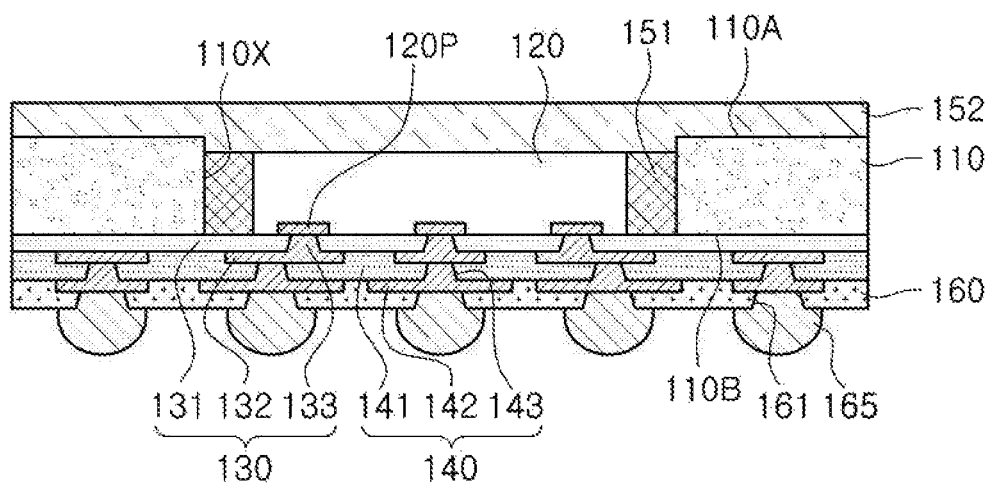
FIG. 15 is a schematic cross-sectional view illustrating another example of a fan-out semiconductor package.

FIG. 15 is a schematic cross-sectional view illustrating another example of a fan-out semiconductor package.

Referring to FIG. 15, a fan-out semiconductor package 100E according to another example has redistribution layers 130 and 140 each including a plurality of layers. Hereinafter, each component included in the fan-out semiconductor package 100E according to another exemplary embodiment will be described in more detail, and contents overlapping with contents above will be omitted, and only differences therebetween will be described.

Each of the redistribution layers 130 and 140 includes a plurality of layers according to a type of a semiconductor chip, and also includes two or more layers unlike illustrated in FIG. 15. The redistribution layers 130 and 140 include insulating layers 131 and 141, first wiring patterns 132 and 142, and first vias 133 and 143, respectively. Descriptions of the redistribution layers 130 and 140 are the same as described above, and will thus be omitted.

Unlike illustrated in FIG. 15, the fan-out semiconductor package 100E according to another exemplary embodiment may be modified to have a shape to which the characteristic shapes of the abovementioned semiconductor packages 100B to 100D are applied. In addition, a method of manufacturing the fan-out semiconductor package 100E according to another exemplary embodiment is the same as described above except for forming the redistribution layers 130 and 140 each including a plurality of layers, or the like, in the abovementioned method of manufacturing the fan-out semiconductor package 100A, and will thus be omitted.

As set forth above, according to exemplary embodiments, a novel structure of a fan-out semiconductor package that may effectively control various side effects that may occur in a manufacturing process thereof, and a method of efficiently manufacturing the same may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a frame having a through hole, and including an upper surface, a lower surface opposing the upper surface, and an inner wall of the through hole connecting the upper surface and the lower surface;
   a semiconductor chip disposed in the through hole, and having a first surface on which an electrode pad of the semiconductor chip is disposed and a second surface opposing the first surface;
   a redistribution layer, on which the frame and the semiconductor chip are disposed, electrically connected to the electrode pads of the semiconductor chip, wherein the lower surface of the frame and the first surface of the semiconductor chip face the redistribution layer;
   a first encapsulant disposed in a space between the frame and the semiconductor chip; and
   a second encapsulant covering the upper surface of the frame, the second surface of the semiconductor chip, and the first encapsulant,
   wherein the first encapsulant and the second encapsulant comprise different materials, and
   the first encapsulant is in contact with a portion of the inner wall of the through hole, and the second encapsulant is in contact with another portion of the inner wall of the through hole.

2. The fan-out semiconductor package of claim 1, wherein the second encapsulant is in contact with the upper surface of the frame.

3. The fan-out semiconductor package of claim 1, wherein a modulus of elasticity of the first encapsulant is lower than a modulus of elasticity of the second encapsulant.

4. The fan-out semiconductor package of claim 1, wherein a coefficient of thermal expansion of the first encapsulant is greater than a coefficient of thermal expansion of the second encapsulant.

5. The fan-out semiconductor package of claim 1, wherein a glass transition temperature of the first encapsulant is greater than a glass transition temperature of the second encapsulant.

6. The fan-out semiconductor package of claim 1, wherein a viscosity of a material for forming the first encapsulant is lower than a viscosity of a material for forming the second encapsulant.

7. The fan-out semiconductor package of claim 1, wherein adhesive strength of the first encapsulant with respect to the semiconductor chip is greater than adhesive strength of the second encapsulant with respect to the semiconductor chip.

8. The fan-out semiconductor package of claim 1, wherein the semiconductor chip comprises an integrated circuit.

9. The fan-out semiconductor package of claim 1, further comprising:
   a through wiring passing through the frame; and
   wiring patterns disposed on the first and second surfaces of the frame, respectively.

10. The fan-out semiconductor package of claim 1, further comprising:
    a passivation layer disposed on one side of the redistribution layer, and having an opening; and
    a connection terminal disposed in the opening,
    wherein the connection terminal is electrically connected to the electrode pad of semiconductor chip through the redistribution layer.

11. The fan-out semiconductor package of claim 1, wherein the second encapsulant comprises an opening.

12. The fan-out semiconductor package of claim 1, further comprising a passivation layer covering the second encapsulant,
    wherein the passivation layer comprises an opening opening a portion of the second encapsulant.

13. The fan-out semiconductor package of claim 1, wherein the second encapsulant is in contact with the second surface of the semiconductor chip.

14. The fan-out semiconductor package of claim 1, wherein the second encapsulant is in contact with the second surface of the semiconductor chip, the upper surface of the frame, and the first encapsulant.

15. A method of manufacturing a fan-out semiconductor package comprising:
    preparing a frame having a through hole;
    disposing a semiconductor chip in the through hole;
    disposing a first encapsulant in a space between the frame and the semiconductor chip;
    after disposing the first encapsulant in the space between the frame and the semiconductor chip, forming a second encapsulant to cover the frame, the first encapsulant, and the semiconductor chip; and
    forming a redistribution layer on the frame and the semiconductor chip, the frame and the semiconductor chip disposed between the redistribution layer and the second encapsulant,
    wherein the first encapsulant and the second encapsulant comprise different materials, and
    the first encapsulant is in contact with a portion of the inner wall of the through hole, and the second encapsulant is in contact with another portion of the inner wall of the through hole.

16. The method of claim 15, further comprising bonding a bonding film to the other side of the frame prior to the disposing the semiconductor chip,
    wherein the semiconductor chip is bonded to the bonding film exposed by the through hole.

17. The method of claim 16, further comprising removing the bonding film prior to the forming the redistribution layer,
    wherein the redistribution layer is formed in a region from which the bonding film is removed.

18. The method of claim 15, wherein the second encapsulant is in contact with the semiconductor chip, the frame, and the first encapsulant.

* * * * *